United States Patent

[11] 3,609,480

[72] Inventor Dieter Gerstner
Willsbach, Germany

[21] Appl. No. 755,922
[22] Filed Aug. 28, 1968
[45] Patented Sept. 28, 1971
[73] Assignee Telefunken Patentverwertungsgesellschaft m.b.H.
Ulm (Danube), Germany
[32] Priority Aug. 30, 1967
[33] Germany
[31] P 16 14 858.6

[54] SEMICONDUCTOR DEVICE WITH COMPENSATED INPUT AND OUTPUT IMPEDANCES
14 Claims, 2 Drawing Figs.

[52] U.S. Cl. .......... 317/235 R,
317/234 R, 317/234 N, 317/234 U, 317/235 W
[51] Int. Cl. .......... H01l 5/00
[50] Field of Search .......... 317/234
(4), 234 (5.4), 234 (3), 234 (9)

[56] References Cited

UNITED STATES PATENTS

| | | | |
|---|---|---|---|
| 3,331,001 | 7/1967 | Luce et al. .......... | 317/235 |
| 3,483,308 | 12/1969 | Wakely .......... | 174/52 |
| 3,431,092 | 3/1969 | Lehner .......... | 29/193.5 |
| 3,423,516 | 1/1969 | Segerson .......... | 174/52 |

*Primary Examiner*—John W. Huckert
*Assistant Examiner*—B. Estrin
*Attorney*—Spencer & Kaye

ABSTRACT: A four-terminal semiconductor device, i.e., a device with two input and two output electrodes, having a semiconductor element, a metallic baseplate which is connected to the semiconductor element and constitutes one of the input and one of the output electrodes, and at least two strip-shaped electrodes which are insulated from the baseplate, extend in opposite directions parallel to the baseplate, and are electrically connected to the semiconductor element. The strip-shaped electrodes have different widths and/or are spaced different distances from the metalic plate so as to provide broadband compensation for the input and output inductances and/or capacitances of the device.

INVENTOR
Dieter Gerstner

BY Spencer & Kaye
ATTORNEYS

SEMICONDUCTOR DEVICE WITH COMPENSATED INPUT AND OUTPUT IMPEDANCES

BACKGROUND OF THE INVENTION

The present invention relates to a four-terminal semiconductor device having a semiconductor element, a metallic baseplate which serves as an electrode and at least tow additional strip-shaped electrodes which are insulated from the base plate.

As used herein, the term "four-terminal semiconductor device" is intended to mean a device containing a semiconductor element, e.g. a transistor, an integrated circuit, etc., having two input and two output electrodes.

The semiconductor element used in the above-mentioned device is preferably a high-frequency transistor or a circuit having a plurality of high-frequency transistors, which transistor or circuit is designed to produce high output power at high frequencies.

The majority of the prior art casings, which are used to provide physical support for and electrical connection to semiconductor elements, employ wire-type connecting leads having a circular cross section. Since the inductance of these leads is relatively high, however, a semiconductor device having this type of casing will not be suited for high frequencies.

In order to reduce the lead inductance, it has already been suggested to construct the leads in the shape of strips. Semiconductor devices have thus been made which exhibit from two to four strip-shaped leads of identical cross section extending outward on a common plane, from a transistor or transistors, like the spores of a wheel. This type of arrangement does in fact achieve a marked reduction in the lead inductance; however, it has been found that the arrangement fails to satisfy all the requirements for high-frequency operation. In particular, although the lead inductance is indeed reduced, the lead capacitance is considerably increased so that high frequency oscillations are dissipated through the shunt capacitances of the leads. These capacitances are particularly high at the points at which two lead strips extend near to each other or at which one lead strip passes near to a metallic body.

SUMMARY OF THE INVENTION

An object of the present invention, therefore, is to provide a four-terminal semiconductor device with input and output leads which exhibit a minimum lead inductance and lead capacitance over a wide frequency range.

This object, as well as other objects which will become apparent in the discussion that follows, is achieved, according to the present invention by providing a four-terminal semiconductor device with a suitable semiconductor element; a metallic plate, electrically connected to the semiconductor element and providing physical support therefor; and at least two strip-shaped electrical conductors, each being electrically connected to the semiconductor element, each having a prescribed width and each being spaced a prescribed distance from the metallic plate. The metallic plate, which then forms the baseplate of the four-terminal semiconductor device, serves as one input and one output, while each of the strip-shaped electrical conductors serves as one of the other inputs and outputs, respectively. The two strip-shaped electrical conductors or leads are arranged to extend in opposite directions, parallel to the metallic baseplate in overlying relationship thereto.

Now, according to the present invention, it is important that the widths of the strip-shaped leads and/or their respective distances from the parallel extending baseplate be different. This lack of symmetry in the input and output leads will then achieve the desired object of reducing the lead inductance and capacitance.

If, according to a preferred embodiment of the present invention, it is necessary to provide a suitable casing for a common emitter-operated planar transistor, the emitter electrode of the transistor is electrically connected to the conductive base plate while the base and collector electrodes are connected with respective ones of the strip-shaped leads. In order to achieve the best high-frequency performance the base lead is usually either made wider than the strip-shaped collector lead, or the base lead is spaced a smaller distance from the baseplate than is the collector lead. This particular choice of geometric dimensions may seem unusual and surprising since considerably more current is conducted through the collector lead than through the base lead. If the lead loads were the only parameters to be considered, it would be natural to construct the collector lead with a greater cross section than the base lead. However, if the leads are constructed and arranged according to this preferred embodiment of the present invention, the greatest amount of distortion-free current will be conducted and the high-frequency properties of the semiconductor device will be improved.

DESCRIPTION OF THE PREFERRED EMBODIMENTS

Figure 1:
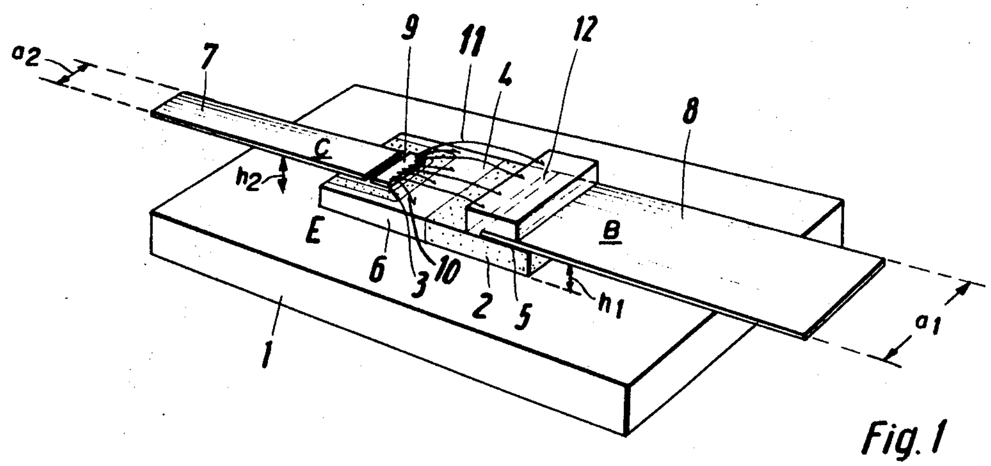
FIG. 1 is a perspective view of a semiconductor device, according to a preferred embodiment of the present invention, before it is embedded in casing material.
Figure 2:
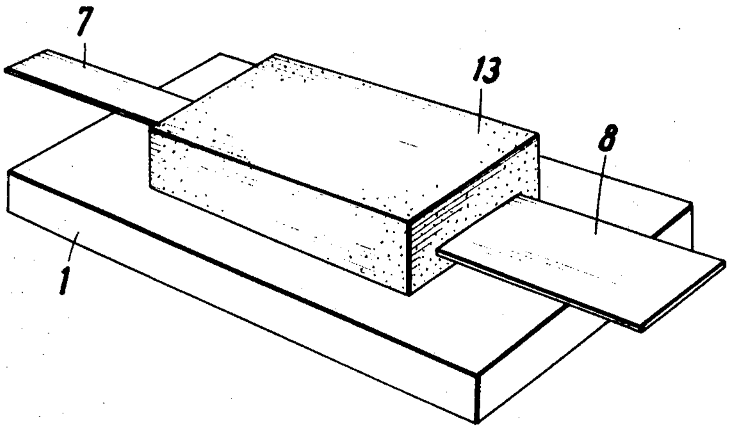
FIG. 2 is a perspective view of the semiconductor device of FIG. 1 with the casing material applied.

The semiconductor device according to the present invention will now be described in detail with reference to a preferred embodiment thereof, which is illustrated in FIGS. 1 and 2. As shown in perspective view in FIG. 1, this preferred embodiment of the semiconductor device includes a metallic baseplate 1 made of a good electric- and heat-conductive material and an intermediate plate 2, mounted thereon, made of an insulating material. The baseplate may consist, for example, of a silvered molybdenum strip, whereas the intermediate plate is preferable made of a ceramic material such as beryllium oxide.

The side of the insulating intermediate plate which faces away from the baseplate is provided with three separate metallized regions 3, 4 and 5; these regions may consist, for example, of a coating of gold. If the intermediate plate is rectangular in shape, as is illustrated in FIG. 1, the three metallized surface regions may be arranged in a row, for example, one behind the other.

The intermediate plate 2 is also provided with metallized side regions 6 which electrically connect the central upper region 4 with the metallic baseplate 1. When the device of FIG. 1 is to include a high-frequency transistor connected in the common emitter configuration, this central surface region 4 serves to provide contact with the emitter electrode of the transistor. If the transistor is to be operated in the common base or common collector configuration, the central metallized region 4 of the intermediate plate and, thus, the metallic baseplate is electrically conductively connected with this respective electrode of the transistor.

On the two outer metallized surface regions 3 and 5 of the insulating intermediate plate 2 are mounted the two strip-shaped electrodes or leads 7 and 8. These leads are constructed with different widths and extend, parallel to the baseplate in opposite directions.

In the case where a single high-frequency transistor is to be connected to form a common emitter circuit, the collector zone of the transistor 9 is soldered onto the metallized region 3 to provide an ohmic connection between the collector of the transistor and the narrow strip lead 7. The emitter electrode or, with plural systems (circuits with more than one transistor), the emitter electrodes of the semiconductor element are electrically connected to the central metallized region 4 through a plurality of thin lead wires 10. The base electrode or electrodes are electrically connected to the outer metallized region 5 and, thus, the wider strip lead through the use of similar lead wires 11. In order to avoid short circuits between the layers of the emitter and the base lead wires 10 and 11, respectively, it is advantageous to provide the attached end of the base strip lead 8 with a metallic elevation 12 so that the base lead wires will extend over the tops of the emitter lead wires.

The optimum distance $h_1$ between the base strip lead 8 and the metallic baseplate 1 and the optimum width $a_1$ of the base strip lead 8 may be calculated to a good approximation using the following formula:

$$(h_1/a_1)=(\sqrt{\epsilon}/360)\cdot r_{bb} \qquad (1)$$

where $\epsilon$ is the relative dielectric constant of the material which fills the space between the base lead 8 and the baseplate 1 and $r_{bb}$ is the value in ohms of the base bulk resistance of the transistor.

Since, in general, the base bulk resistance is inversely proportional to the power for which the particular transistor is rated, the width of the base strip lead is also proportional while the distance between this strip lead and the baseplate is inversely proportional to the rated power.

If the semiconductor element 9 is a high-frequency transistor designed for a high-frequency power of 10 watts, then, for example, the width of the base strip lead 8 may be made approximately 10 mm. and the distance between this strip lead and the metallic baseplate made 0.5 mm.

To calculate the optimum width $a_2$ of the collector strip lead 7 and the optimum distance $h_2$ between this strip lead and the metallic baseplate 1, the following formula may be used:

$$(h_2/a_2)=(\sqrt{\epsilon}/750)\cdot(U_{Batt}/N) \qquad (2)$$

Here the quantity $U_{Batt}$ is the voltage applied by the DC voltage source connected to the collector while $N$ is the high-frequency power, in watts, which the transistor can deliver.

Using the above formulas it may be seen, for example, that a high-frequency transistor designed to deliver 20 watts when driven by a battery voltage of 30 v., and which exhibits a base bulk resistance of 4 ohms, will exhibit optimum high-frequency characteristics when the ratio $(h_1/a_1)=(1/32)$. It is assumed here that the relative dielectric constant of the material located between the baseplate and the strip leads 7 and 8 is approximately $\beta=9$.

If the distance between the base strip lead 8 and the metallic plate 1 is 0.3 mm., the base strip lead can be given a width of 10 mm. It should be clear that other dimensions can also be chosen so long as the ratio between $h_1$ and $a_1$ remains the same. For these assumed values of voltage power and the dielectric constant in the example given above, the ratio $h_2/a_2$ may be found from the formula (2) above to be 1/5.

The collector strip lead might, therefore, be constructed with a distance from the baseplate and a width, for example, of 1 and 5 mm., respectively, or, as another example, of 2 and 10 mm., respectively.

The geometric relationships which the above-noted formulas determine by way of calculation have been proven correct in experimental tests. These tests have shown that it is, in fact, possible to achieve broadband compensation of the lead capacitances and inductances through the use of these dimensional relationships. For different types of transistors, the numerical values given above may differ by approximately a factor of 2.

The distance of the strip leads from the metallic baseplate is preferably adjusted by controlling the thickness of the insulating intermediate plate 2 which carries the semiconductor element. If the strip leads are to be spaced different distances from the metallic plate, it is practical to make those ends of the intermediate plate which serve to hold the strip leads of different thicknesses; that is, so that at its two ends, the insulating plate will correspond in thickness to the desired separation from the base plate of the respective strip leads.

It is also possible to adjust the distance between the metallic baseplate and the parallel extending strip leads by providing one or both of the strip leads with a Z-shaped bend.

FIG. 2 illustrates the final form of the semiconductor device of FIG. 1. To complete the manufacture, the insulating intermediate plate 2, the semiconductor body or element 9 and the connected ends of the strip leads 7 and 8 of the device of FIG. 1 are embedded or cast in a material 13. This casing material, which may be glass, a ceramic or a plastic, determines the dielectric constant which is used in the formulas (1) and (2).

It will be understood that the above description of the present invention is susceptible to various modifications, changes and adaptations. It is possible, for example, to vary the arrangement of the metallized island regions on the insulating intermediate plate or to vary the choice of materials. It is also possible to correspondingly apply the formulas, which have been given for a transistor in a common emitter circuit, to transistors which are operated in other types of circuits. It is also possible to use the semiconductor device, according to the present invention, with common base or common collector transistor circuits, instead of the common emitter circuit described above. If this is done, the base or collector, respectively, should be connected to the metallic baseplate and the remaining two transistor electrodes connected to the two strip leads. In this case, instead of $r_{bb}$ in formula (1) the real part of input impedance is to be used for the base respectively collector configuration.

The important feature in the present invention is the flat or planar construction of a transistor mount and the use of input and output strip-shaped leads which are unsymmetrical with respect to each other and which extend parallel to a metallic baseplate employed as a conductor. The geometry of the input and output leads as well as the distance between these leads and the baseplate is then so chosen that the transistor, or other semiconductor element built into this device, will have the optimum high-frequency characteristics.

I claim:

1. A high-frequency semiconductor device having two input and two output electrodes comprising, in combination:

a. a semiconductor element;

b. a metallic plate, electrically connected to said semiconductor element and providing physical support therefor said metallic plate constituting one of said input and one of said output electrodes;

c. at least two strip-shaped electrical conductors, each of which is insulated form said metallic plate and electrically connected to said semiconductor element, said strip-shaped conductors extending in opposite directions parallel to said metallic plate in overlying relationship thereto and being at least one of the following:

1. of different widths; and
2. spaced different distances from said metallic plate, so as to provide broadband compensation for the input and output inductances and/or capacitances of said device.

2. The semiconductor device defined in claim 1, further comprising an insulating plate disposed between said semiconductor element and said metallic plate.

3. The semiconductor device defined in claim 2, wherein said semiconductor element includes at least one planar transistor.

4. The semiconductor device defined in claim 3, wherein said at least one transistor has an emitter, a base and a collector, and wherein said emitter is connected to said metallic plate by a metal coating extending over the surface of said insulating plate, and said base and said collector are electrically connected to respective ones of said strip-shaped conductors.

5. The semiconductor device defined in claim 4, wherein the base-connected strip-shaped conductor is wider than the collector-connected strip-shaped conductor.

6. The semiconductor device in claim 4, wherein the base-connected strip-shaped conductor is spaced a lesser distance from said metallic plate than said collector-connected strip-shaped conductor.

7. The semiconductor device defined in claim 2, further comprising three separated metallized regions serially arranged, one next to the other, on the surface of said insulating plate which faces away from said metallic plate, the central one of said three regions being electrically connected with said metallic plate by at least one further metallized region extending along at least one side surface of said insulating plate between said central region and said metallic plate, wherein the two outer ones of said three metallized regions are connected to respective ones of said strip-shaped conductors, wherein said semiconductor element includes at least one transistor having a base, an emitter and a collector, wherein the collector of said at least one transistor is in ohmic contact with one of said two outer regions, and wherein the other of said two outer regions and said central region are each electrically connected to one of said base and emitter by means of thin lead wires.

8. The semiconductor device defined in claim 7, wherein said insulating plate has different thicknesses at said two outer regions, thereby to cause said two strip-shaped conductors, which are each respectively connected to one of said two outer regions, to be spaced different distances from said metallic plate.

9. The semiconductor device defined in claim 2, wherein said insulating plate is made of ceramic.

10. The semiconductor device defined in claim 2, wherein said insulating plate, said semiconductor element, and the electrical connections between said semiconductor element and said two strip-shaped conductors are embedded in a mass of material selected from the group consisting of plastic, glass and ceramic.

11. The semiconductor device defined in claim 1, wherein said metallic plate consists of silver-plated molybdenum.

12. The semiconductor device defined in claim 1, wherein said semiconductor element is a 10 watt high-frequency transistor, and wherein one of said strip-shaped conductors is connected to the base of said transistor, said one conductor having a width of approximately 10 mm. and being spaced a distance of 0.5 mm. from said metallic plate.

13. The semiconductor device defined in claim 1, wherein said semiconductor element includes at least one high-frequency transistor, and wherein one of said strip-shaped conductors is connected to the base of said at least one transistor, said one conductor having a width which is proportional, and being spaced a distance which is inversely proportional to the rated power of said at least one transistor.

14. The semiconductor device defined in claim 7, further comprising a metallic elevation disposed between said other of said two outer regions and the ones of said thin lead wires, which connect said other outer region to one of said base and emitter, thereby to separate said ones of said thin lead wires from those of said thin lead wires which are electrically connected to said central region.